(12) United States Patent
Watanabe

(10) Patent No.: US 6,970,326 B2
(45) Date of Patent: Nov. 29, 2005

(54) MAGNETIC HEAD PROVIDED WITH RESIN-MOLDED IC BARE-CHIP BETWEEN HEIGHT-RESTRICTION PLATE AND SUSPENSION AND METHOD FOR MANUFACTURING MAGNETIC HEAD

(75) Inventor: Mitsuru Watanabe, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 344 days.

(21) Appl. No.: 10/183,899

(22) Filed: Jun. 27, 2002

(65) Prior Publication Data

US 2003/0002219 A1    Jan. 2, 2003

(30) Foreign Application Priority Data

Jul. 2, 2001 (JP) .............................. 2001-200404
Apr. 3, 2002 (JP) .............................. 2002-100787

(51) Int. Cl.[7] ............................................. G11B 21/16
(52) U.S. Cl. ................................................. 360/244.1
(58) Field of Search ................... 360/244.1; 257/678, 257/704, 705, 706, 707, 687, 717, 738, 778, 257/779

(56) References Cited

U.S. PATENT DOCUMENTS

| 6,202,288 B1 | 3/2001 | Shiraishi et al. | |
| 6,268,980 B1 | 7/2001 | Shiraishi et al. | |
| 6,282,062 B1 | 8/2001 | Shiraishi | |
| 6,498,702 B1 * | 12/2002 | Shimizu et al. | 360/244.1 |
| 6,618,225 B2 * | 9/2003 | Shimizu et al. | 360/244.1 |
| 6,665,148 B2 * | 12/2003 | Shiraishi et al. | 360/244.1 |
| 6,885,522 B1 * | 4/2005 | Kira et al. | 360/244.1 |
| 2001/0030836 A1 * | 10/2001 | Katsumata | 360/244.1 |
| 2002/0024767 A1 * | 2/2002 | Nakamura et al. | 360/244.1 |
| 2002/0034050 A1 * | 3/2002 | Fujiwara et al. | 360/244.1 |
| 2002/0093766 A1 * | 7/2002 | Wachtler | 360/244.1 |
| 2003/0099065 A1 * | 5/2003 | Watanabe | 360/244.1 |

FOREIGN PATENT DOCUMENTS

| JP | 03187295 A | * | 8/1991 | ............ H05K 7/20 |
| JP | 7-335982 | | 12/1995 | |
| JP | 9-162198 | | 6/1997 | |
| JP | 11-150214 | | 6/1999 | |
| JP | 2000-294696 | | 10/2000 | |
| JP | 2001-134916 | | 5/2001 | |

OTHER PUBLICATIONS

Copy of Office Action dated Aug. 12, 2004 for Japanese Patent Application No. 2002-100787.

* cited by examiner

Primary Examiner—William J. Klimowicz
(74) Attorney, Agent, or Firm—Brinks Hofer Gilson & Lione

(57) ABSTRACT

A height-restriction plate having a size in plan view larger than that of an IC chip is bonded to an upper face of the IC chip which is fixed to a FPC formed along a suspension. The IC chip is sealed at the periphery thereof with an adhesive which reaches the height-restriction plate and the FPC.

7 Claims, 2 Drawing Sheets

MAGNETIC HEAD PROVIDED WITH RESIN-MOLDED IC BARE-CHIP BETWEEN HEIGHT-RESTRICTION PLATE AND SUSPENSION AND METHOD FOR MANUFACTURING MAGNETIC HEAD

BACKGROUND OF THE INVENTION

1. Field of the Invention

The present invention relates to a chip-on-suspension-type magnetic head device and a method for manufacturing a chip-on-suspension-type magnetic head device.

2. Description of the Related Art

Chip-on-suspension-type magnetic head devices have been known as magnetic head devices in which weak read-signals from magnetic heads are amplified directly by IC chips mounted on suspensions so that the effect of noises due to stray capacitance or stray inductance is reduced. In the chip-on-suspension-type magnetic head devices, IC chips which intervene in signal circuits between the magnetic heads and control circuits are mounted on and fixed to FPCs (flexible printed circuits) which connect the magnetic heads with the control circuits and which are disposed on the suspensions which support the magnetic heads.

When an IC chip is mounted on a suspension, it is necessary to protect the IC chip from the environmental influence (for example, heat and moisture) and impacts and to prevent the IC chip from spreading dust. An IC chip, which is generally made of a material such as Si or Ge, spreads Si or Ge dust when it is not sealed with a resin, whereby there is a risk in that a magnetic head for a hard disk is crushed.

Therefore, the IC chips fixed onto the suspensions have been hitherto sealed by piling up resins (adhesive) onto the upper faces of the IC chips. However, there has been a problem in that the thickness of the IC-chip parts is increased or the IC chips are partly exposed because of inaccurate thicknesses of the resin caused by simply piling up the resin onto the IC chips. When the thickness of the IC-chip parts is unnecessarily increased because of the excessively applied resin, for example, the size of the hard disk devices cannot be reduced and a risk occurs in that suspensions interfere with each other when a plurality of the suspensions are laminated in the thickness direction. When the IC chips are partly exposed because the amount of the resin is excessively small, the risk of spreading dust is increased.

SUMMARY OF THE INVENTION

Accordingly, it is an object of the present invention to provide a chip-on-suspension-type magnetic head and a method for manufacturing a chip-on-suspension-type magnetic head in which the thickness of an IC-chip part on a suspension does not unnecessarily increase or variations in the thickness does not occur and the IC-chip part is prevented from spreading dust by being sealed sufficiently.

To these ends, according to an aspect of the present invention, a chip-on-suspension-type magnetic head device comprises a suspension for supporting a magnetic head; a FPC formed along the suspension, for connecting between the magnetic head and a control circuit; and an IC chip fixed to the FPC and intervening in a signal circuit formed between the magnetic head and the control circuit. A height-restriction plate having a size in plan view larger than that of the IC chip is bonded to an upper face of the IC chip which is fixed to the FPC, and the IC chip is sealed at the periphery thereof with an adhesive which reaches the height-restriction plate and the FPC.

With this arrangement, the thickness of the IC chip part is restricted (is set) by the height-restriction plate, whereby the thickness of the IC chip part does not unnecessarily increase, that is, the thickness can be controlled so as to have a predetermined value, and exposure of the IC chip can be avoided.

According to another aspect of the present invention, a method for manufacturing a chip-on-suspension-type magnetic head device which comprises a FPC formed on a suspension for supporting a magnetic head, for connecting the magnetic head and a control circuit, and an IC chip fixed to the FPC comprises the steps of (a) applying an adhesive to an upper face of the IC chip mounted on the FPC; (b) pressing the adhesive applied to the upper face of the IC chip with a height-restriction plate having a size in plan view larger than that of the IC chip; and (c) sealing the IC chip at the periphery thereof with the adhesive which reaches the height-restriction plate and the FPC.

Although the entire adhesive may comprise an ultraviolet-curing resin, at least one portion of the adhesive for bonding the height-restriction plate to the IC chip preferably comprises an ultraviolet-curing resin. The adhesive may contain a filler having thermal conductivity higher than that of the adhesive.

The height-restriction plate may comprise, for example, a metallic plate, an ultraviolet-transmitting resin plate, or a resin plate containing a thermally conductive filler, or may be made of an inorganic ceramic.

The adhesive comprising an ultraviolet-curing resin and the height-restriction plate made of an ultraviolet-transmitting resin are preferably used for bonding by using ultraviolet rays.

According to the present invention, a chip-on-suspension-type magnetic head in which variations in the thickness of an IC chip part and dusts therefrom can be suppressed is obtainable.

DESCRIPTION OF THE PREFERRED EMBODIMENTS

Figure 2:
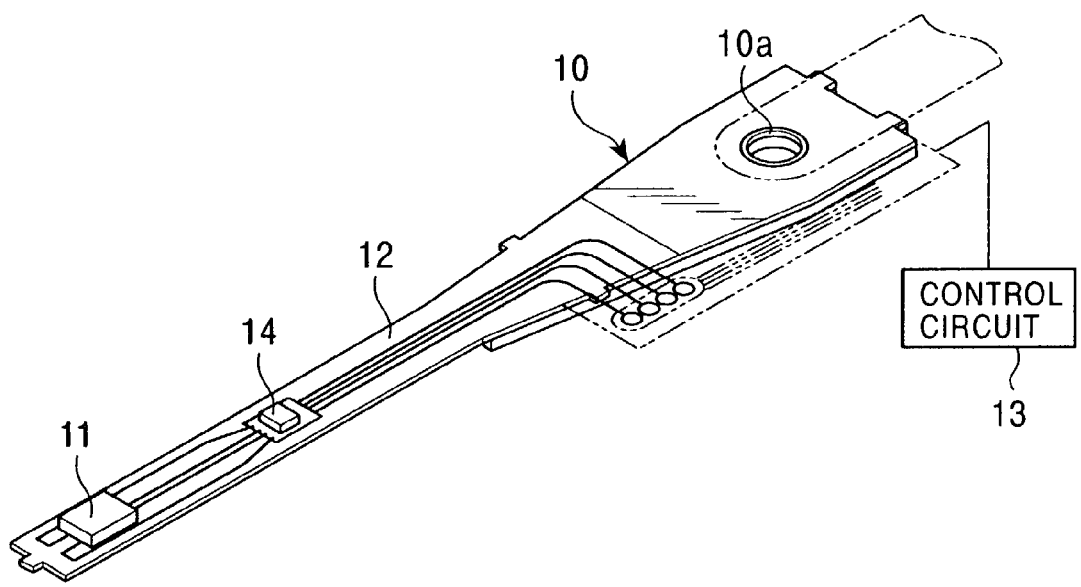
FIG. 2 is a perspective view of a chip-on-suspension-type magnetic head.
Figure 3:
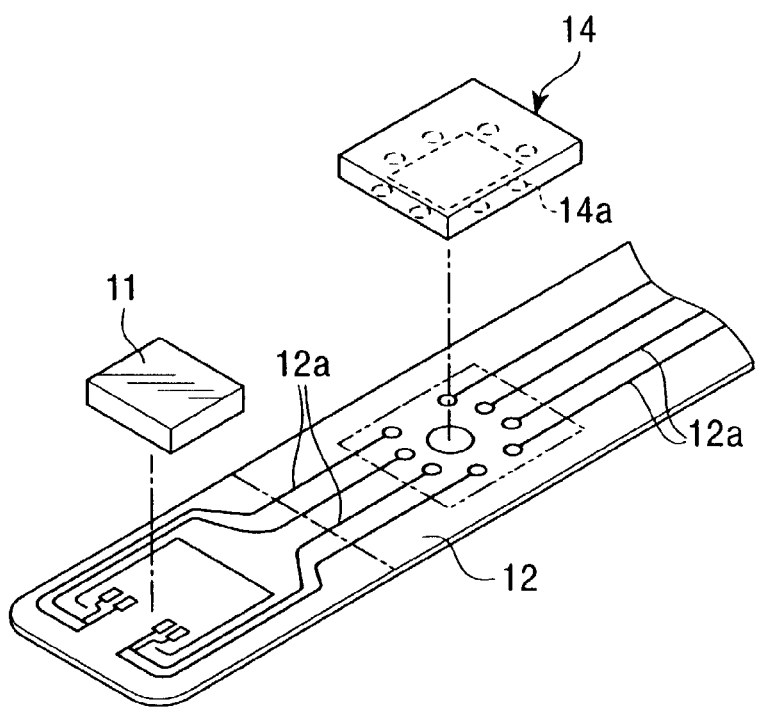
FIG. 3 is an exploded perspective view of an arrangement including a FPC, an IC chip, and a magnetic head (slider).

FIGS. 2 and 3 show a chip-on-suspension-type magnetic head. A magnetic head (slider) 11 is mounted on a suspension 10 at an end thereof, which is made of stainless steel. The magnetic head 11 writes and reads magnetic data to and from a recording disk. The suspension 10 is provided at the base end thereof with a pivoting point 10a which is positioned outside the recording disk. When the suspension 10 pivots on the pivoting point 10a, the magnetic head 11 disposed at the free end of the suspension 10 moves in a radial direction of the recording disk. The suspension 10 is provided thereon with a FPC 12 having pattern wirings 12a. The magnetic head 11 is connected to an exterior control-circuit 13 via the FPC 12.

An IC chip (semiconductor device) 14 is fixed to the FPC 12 and intervenes in a signal circuit which connects between the magnetic head 11 and the exterior control-circuit 13. The IC chip 14 is electrically connected and fixed to the pattern wirings 12a of the FPC 12 at bumps 14a of the IC chip 14, amplifies read signals from the magnetic head 11, and sends the amplified read signals to the exterior control-circuit 13. The magnetic head 11 may be provided with an offset-correction arrangement (not shown) mounted on the suspension 10. The offset-correction arrangement serves to correct an offset in tracking of the magnetic head 11 in a radial direction of a recording disk, the offset being likely to occur in recording disks which recently have highly dense tracks. The IC chip 14 may include a control circuit for the offset-correction arrangement.

FIGS. 1A, 1B, 1C, and 1D show a manufacturing method of a magnetic head in the order of processes. When the IC chip 14 is mounted on the FPC 12 disposed on the suspension 10, the bumps 14a disposed on the lower face of the IC chip 14 are electrically connected and fixed to the pattern wirings 12a of the FPC 12. Generally, the FPC 12 is partly bonded to the suspension 10, and is free from the suspension 10 in the other portions. The IC chip 14 is fixed to the FPC 12 at the portion of the FPC 12 at which the FPC 12 is bonded to the suspension 10, according to the present embodiment. In the following description, therefore, it is simply referred to as "the IC chip 14 is fixed to the suspension 10". The bumps of the magnetic head (slider) 11 are also electrically connected and fixed to the pattern wirings 12a of the FPC 12.

Figure 1A:
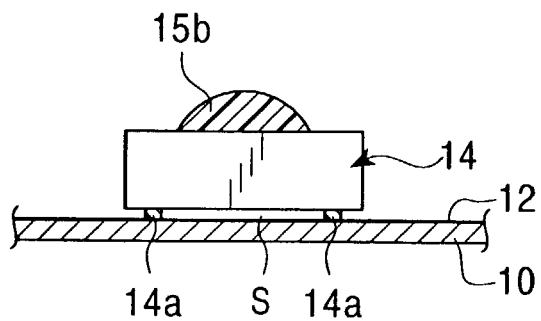
FIGS. 1A, 1B, 1C, and 1D are sectional views showing a method for manufacturing a chip-on-suspension-type magnetic head according to an embodiment of the present invention in the order of processes.

When the IC chip 14 are connected and fixed to the pattern wirings 12a of the FPC 12 with the bumps 14a therebetween, a small gap S is formed between the suspension 10 and the IC chip 14, as shown in FIG. 1A. Instead, a resin may be applied to the lower face of the IC chip 14 at several portions thereof such that the resin supports the IC chip 14 on the suspension 10 with the gap S formed between the suspension 10 and the IC chip 14.

After the IC chip 14 is thus mounted on the suspension 10, the IC chip 14 is applied thereon with a resin (adhesive) 15b, as shown in FIG. 1A.

Figure 1B:
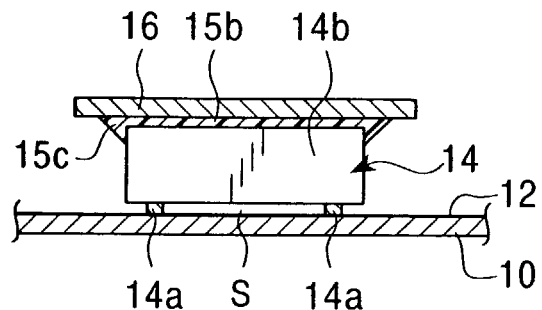

Then, as shown in FIG. 1B, a height-restriction plate 16 having a size in plan view larger than that of the IC chip 14 is pressed onto the resin 15b applied to the upper face of the IC chip 14 such that the sides of the height-restriction plate 16 individually project from the sides of the IC chip 14. A portion of the resin 15b not necessary for bonding the height-restriction plate 16 to the upper face of the IC chip 14 is pushed out from the sides of the upper face of the IC chip 14. Since the height-restriction plate 16 is pressed onto the IC chip 14, the position of the height-restriction plate 16 with respect to the suspension 10 is significantly accurately set.

The resin 15b pushed out from the sides of the upper face of the IC chip 14 forms top-fillets 15c between the height-restriction plate 16 projected from the sides of the upper face of the IC chip 14 and the upper parts of the sides of the IC chip 14.

Figure 1C:
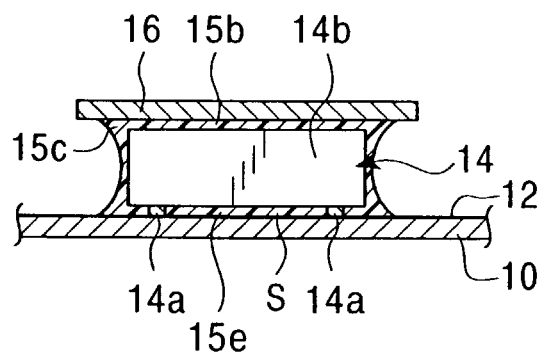

As shown in FIG. 1C, a resin 15e as an underfill material is injected into the gap S between the lower face of the IC chip 14 and the IC-chip-mounting face of the suspension 10. The resin 15e, which flows along the lower face of the IC chip 14, seals the entire lower face of the IC chip 14, and forms under-fillets 15a between the lower face of the IC chip 14 and the suspension 10.

Figure 1D:
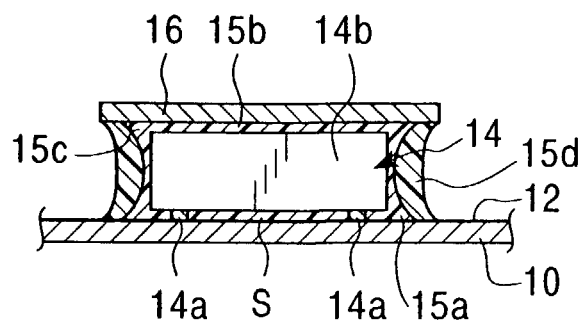

In FIG. 1D, after the under-fillets 15a are formed, a resin 15d is piled up in a space formed between the suspension 10 and the height-restriction plate 16 and along side faces 14b of the IC chip 14. The IC chip 14 is coated at the side faces 14b thereof with the resin 15d which merges with the top-fillets 15c and the under-fillets 15a. The resin 15d seals the side faces 14b of the IC chip 14. The IC chip 14 is hermetically sealed at the upper, lower, and side faces thereof with the lower and top-fillets 15a and 15c, the resins 15b, 15d, and 15e. Therefore, the problem of dusts spread from the IC chip 14 is avoided, and the height of the overall IC chip 14 after being sealed is restricted (is set) to the position of the height-restriction plate 16, whereby the IC chip 14 can be mounted in a hard disk device without any problem.

According to the embodiment described above, the IC chip 14 is sealed at the periphery thereof in two processes after the height-restriction plate 16 is bonded to the upper face of the IC chip 14, with a resin material (adhesive) 15 including the under-fillet 15a, the top-fillet 15c, and the resins 15b, 15d, and 15e, which reaches the height-restriction plate 16 and the FPC 12. However, the IC chip 14 may be sealed in, for example, one process.

Although according to the present embodiment, the resin material (adhesive) 15 may include any resin, at least the resin 15b, which is used for bonding the height-restriction plate 16 to the upper face of the IC chip 14 and forms the top-fillets 15c, is preferably an ultraviolet-curing resin, in which the height-restriction plate 16 is made of an ultraviolet-transmitting material. By using an ultraviolet-curing resin, a process such as a thermal treatment, which requires large facilities and is time-consuming, can be eliminated, whereby bonding can be performed at a low cost and in a short time. The resin materials other than the resin 15b where the resin 15b is an ultraviolet-curing resin may be a thermosetting resin. With this arrangement, final fixing can be performed with the thermosetting resin whereas tentative fixing of the height-restriction plate 16 is performed by using ultraviolet rays.

The height-restriction plate 16 may be formed of a metal such as stainless steel (SUS), a resin containing a highly heat-conductive filler, or an inorganic ceramic such as alumina. Aluminum nitride, silicon nitride, or the like may be used as the highly heat-conductive filler. The highly heat-conductive filler content is preferably at least 40 wt % with respect to the resin. The resin material (adhesive) 15 may also contain a heat-conductive filler. By mixing a highly heat-conductive filler with the height-restriction plate 16 and/or the resin material 15, the heat of the IC chip 14 can be diffused to the outside via the height-restriction plate 16 and/or the resin material 15, thereby preventing the IC chip 14 from being damaged by heat. Moreover, the suspension 10 can be prevented from being deformed with the heat of the IC chip 14.

What is claimed is:

1. A method for manufacturing a chip-on-suspension-type magnetic head device which comprises a flexible printed circuit board (FPC) formed on a suspension that supports a magnetic head, for connecting the magnetic head and a control circuit, and an IC chip fixed to the FPC, the method comprising:
   (a) applying an adhesive to an upper face of the IC chip mounted on the FPC;
   (b) pressing the adhesive applied to the upper face of the IC chip with a height-restriction plate having a size in plan view larger than that of the IC chip; and
   (c) sealing the IC chip at a periphery thereof with the adhesive which reaches the height-restriction plate and the FPC, wherein the adhesive comprises an ultraviolet-curing resin, and the height-restriction plate is made of an ultraviolet-transmitting resin.

2. A chip-on-suspension-type magnetic head devide comprising:
   a suspension that supports a magnetic head;
   a flexible printed circuit board (FPC) formed along the suspension that connects between the magnetic head and a control circuit;
   an IC chip fixed to the FPC and intervening in a signal circuit formed between the magnetic head and the control circuit; and
   a height-restriction plate,
   wherein the height-restriction plate comprises an ultraviolet-transmitting resin plate having a size in plan view larger than that of the IC chip is bonded to an upper face of the IC chip, and the IC chip is sealed at a periphery thereof with an adhesive which reaches the height-restriction plate and the FPC.

3. A magnetic head device according to claim 2, wherein at least one portion of the adhesive that bonds the height-restriction plate to the IC chip comprises an ultraviolet-curing resin.

4. A magnetic head device according to claim 2, wherein the adhesive contains a filler having thermal conductivity higher than that of the adhesive.

5. A chip-on-suspension-type magnetic head devide comprising:
   a suspension that supports a magnetic head;
   a flexible printed circuit board (FPC) formed along the suspension that connects between the magnetic head and a control circuit;
   an IC chip fixed to the FPC and intervening in a signal circuit formed between the magnetic head and the control circuit; and
   a height-restriction plate,
   wherein the height-restriction plate comprises a resin plate containing a thermally conductive filler, the height-restriction plate having a size in plan view larger than that of the IC chip is bonded to an upper face of the IC chip, and the IC chip is sealed at a periphery thereof with an adhesive which reaches the height-restriction plate and the FPC.

6. A magnetic head device according to claim 5, wherein at least one portion of the adhesive that bonds the height-restriction plate to the IC chip comprises an ultraviolet-curing resin.

7. A magnetic head device according to claim 5, wherein the adhesive contains a filler having thermal conductivity higher than that of the adhesive.

* * * * *